United States Patent
Lu et al.

(10) Patent No.: US 12,417,948 B2
(45) Date of Patent: Sep. 16, 2025

(54) HYBRID FILM SCHEME FOR SELF-ALIGNED CONTACT

(71) Applicant: Taiwan Semiconductor Manufacturing Co., Ltd., Hsinchu (TW)

(72) Inventors: Jian-Hong Lu, Hsinchu (TW); Tsai-Jung Ho, Xihu Township (TW); Bor Chiuan Hsieh, Taoyuan (TW); Po-Cheng Shih, Hsinchu (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 956 days.

(21) Appl. No.: 17/524,830

(22) Filed: Nov. 12, 2021

(65) Prior Publication Data
US 2022/0246473 A1    Aug. 4, 2022

Related U.S. Application Data

(60) Provisional application No. 63/145,622, filed on Feb. 4, 2021.

(51) Int. Cl.
*H10D 64/68* (2025.01)
*H01L 21/768* (2006.01)
(Continued)

(52) U.S. Cl.
CPC ..... *H01L 21/76897* (2013.01); *H10D 30/024* (2025.01); *H10D 64/01* (2025.01);
(Continued)

(58) Field of Classification Search
None
See application file for complete search history.

(56) References Cited

U.S. PATENT DOCUMENTS 9,105,490 B2    8/2015   Wang et al.
9,236,267 B2    1/2016   De et al.
(Continued)

FOREIGN PATENT DOCUMENTS

DE   102020119275 A1   12/2021
TW      201732899 A     9/2017
(Continued)

*Primary Examiner* — Steven B Gauthier
*Assistant Examiner* — Lamont B Koo
(74) *Attorney, Agent, or Firm* — Slater Matsil, LLP

(57) ABSTRACT

A method of forming a semiconductor device includes: forming a fin protruding above a substrate; forming a metal gate over the fin, the metal gate being surround by a dielectric layer; etching the metal gate to reduce a height of the metal gate, where after the etching, a recess is formed over the metal gate between gate spacers of the metal gate; lining sidewalls and a bottom of the recess with a semiconductor material; filling the recess by forming a dielectric material over the semiconductor material; forming a mask layer over the metal gate, where a first opening of the mask layer is directly over a portion of the dielectric layer adjacent to the metal gate; removing the portion of the dielectric layer to form a second opening in the dielectric layer, the second opening exposing an underlying source/drain region; and filling the second opening with a conductive material.

20 Claims, 18 Drawing Sheets

(51) Int. Cl.
  *H10D 30/01* (2025.01)
  *H10D 64/01* (2025.01)
  *H10D 84/01* (2025.01)
  *H10D 84/03* (2025.01)
  *H10D 30/62* (2025.01)
  *H10D 64/23* (2025.01)

(52) U.S. Cl.
  CPC ..... *H10D 84/0149* (2025.01); *H10D 84/0158* (2025.01); *H10D 84/038* (2025.01); *H10D 30/6219* (2025.01); *H10D 64/259* (2025.01)

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,157,783 B2 | 12/2018 | Chang et al. | |
| 10,164,053 B1 | 12/2018 | Chung et al. | |
| 10,734,233 B2 | 8/2020 | Zang et al. | |
| 2012/0139061 A1* | 6/2012 | Ramachandran | H01L 29/78 |
| | | | 438/586 |
| 2015/0021683 A1* | 1/2015 | Xie | H10D 64/015 |
| | | | 438/270 |
| 2020/0105577 A1 | 4/2020 | Liang et al. | |
| 2020/0251390 A1 | 8/2020 | More et al. | |
| 2021/0384316 A1 | 12/2021 | Yu et al. | |

FOREIGN PATENT DOCUMENTS

| | | |
|---|---|---|
| TW | 201810532 A | 3/2018 |
| TW | 201913748 A | 4/2019 |
| TW | 201937608 A | 9/2019 |

* cited by examiner

HYBRID FILM SCHEME FOR SELF-ALIGNED CONTACT

PRIORITY CLAIM AND CROSS-REFERENCE

This application claims the benefit of the U.S. Provisional Application No. 63/145,622, filed on Feb. 4, 2021 and entitled "Hybrid Film SAC by Si Liner and SiN to Improve MD HM Bite/Chopping," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
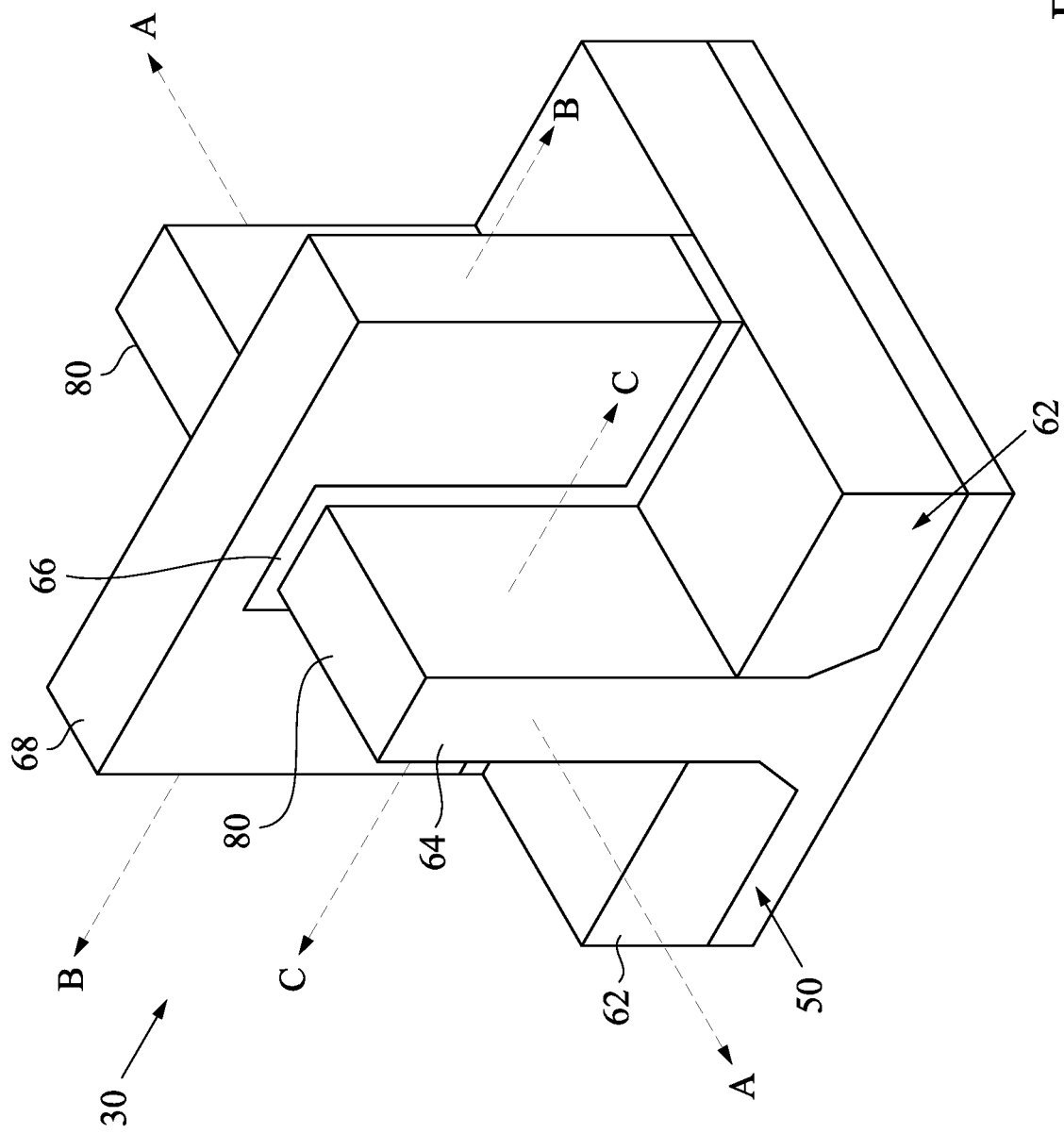
FIG. 1 illustrates a perspective view of a Fin Field-Effect Transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same reference numeral in different figures refers to the same or similar component formed by a same or similar method using a same or similar material(s).

Embodiments of the present disclosure are discussed in the context of forming a FinFET device, and in particular, in the context of forming self-aligned contact plugs for a FinFET device. Although the disclosed embodiment is discussed using FinFET device as an example, the disclosed methods may also be used in other types of devices, such as planar devices.

In some embodiments, when forming a self-aligned source/drain contact, a hybrid film structure is formed over a metal gate structure between gate spacers of the metal gate structure to reduce chopping effect. For example, the metal gate structure, which is surrounded by an inter-layer dielectric (ILD) layer, is recessed to form a recess between the gate spacers that extend along sidewalls of the metal gate structure. A semiconductor liner (e.g., a silicon liner) is conformally formed along sidewalls and a bottom of the recess, and a dielectric material (e.g., silicon nitride) is then formed on the semiconductor liner in the recess to fill the recess. The semiconductor liner and the dielectric material in the recess are collectively referred to as a hybrid film structure. A mask layer is then formed over the ILD layer, where an opening in the mask layer is directly over the hybrid film structure and a portion of the ILD layer disposed over a source/drain region. An etching process is performed next using the mask layer as an etching mask to remove the portion of the ILD layer to form an opening in the ILD layer, where the opening exposes the underlying source/drain region. Next, a conductive material is formed in the opening to form the self-aligned source/drain contact. Due to the etching selectivity provided by the hybrid film structure during the etching process to form the opening, chopping effect is reduced, which in turn reduces device defects related to short-circuit caused by the chopping effect.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, e.g., a current flow between the source/drain regions 80. Cross-section C-C is parallel to cross-section B-B and is across the source/drain region 80. Subsequent figures refer to these reference cross-sections for clarity.

FIGS. 2-6, 7A-7C, and 8-15 are cross-sectional views of a FinFET device 100 at various stages of fabrication, in accordance with an embodiment. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6, 7A, and 8-15 illustrate cross-sectional views of the FinFET device 100 along cross-section A-A. FIGS. 7B and 7C illustrate embodiment cross-sectional views of the FinFET device 100 along cross-section C-C.

Figure 2:
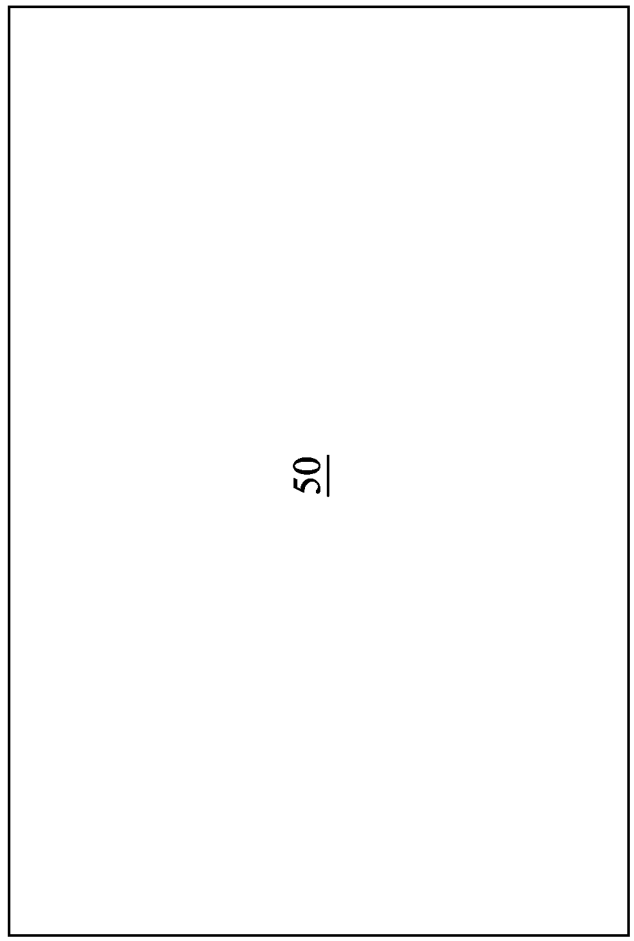
FIGS. 2-6, 7A-7C, and 8-15 illustrate various cross-sectional views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
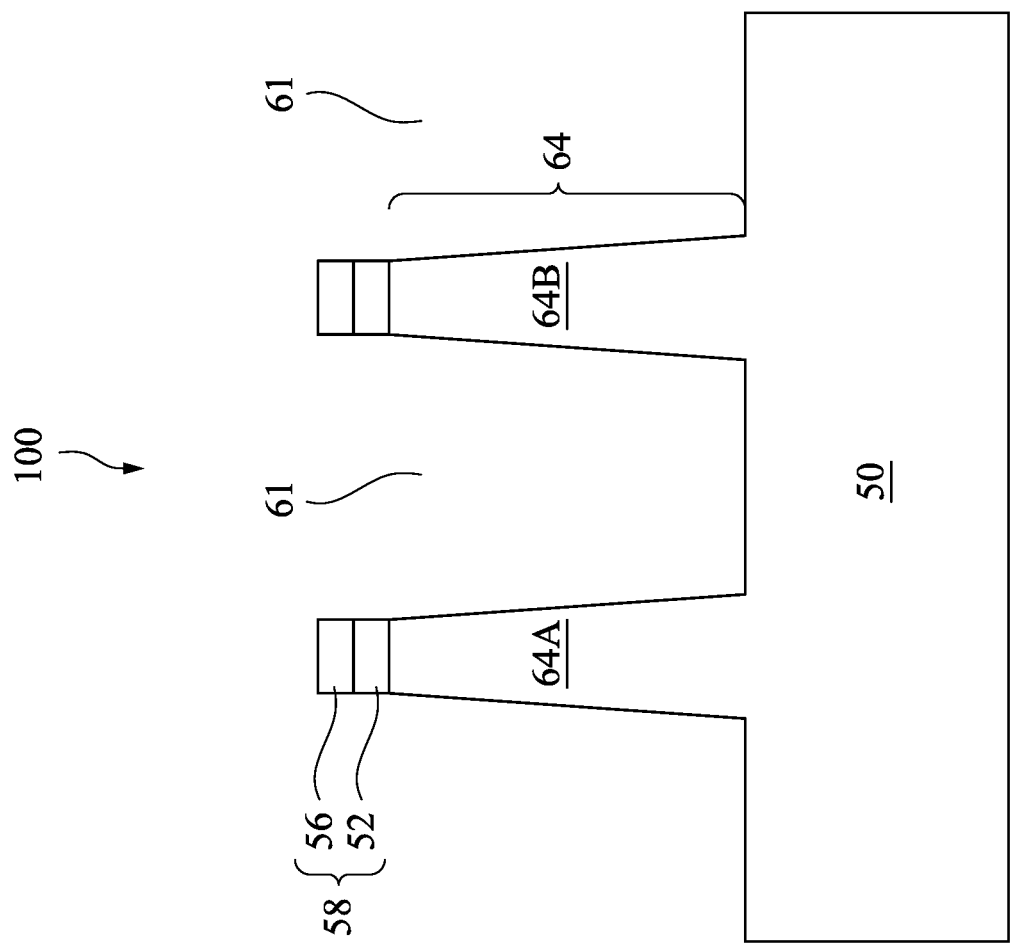

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
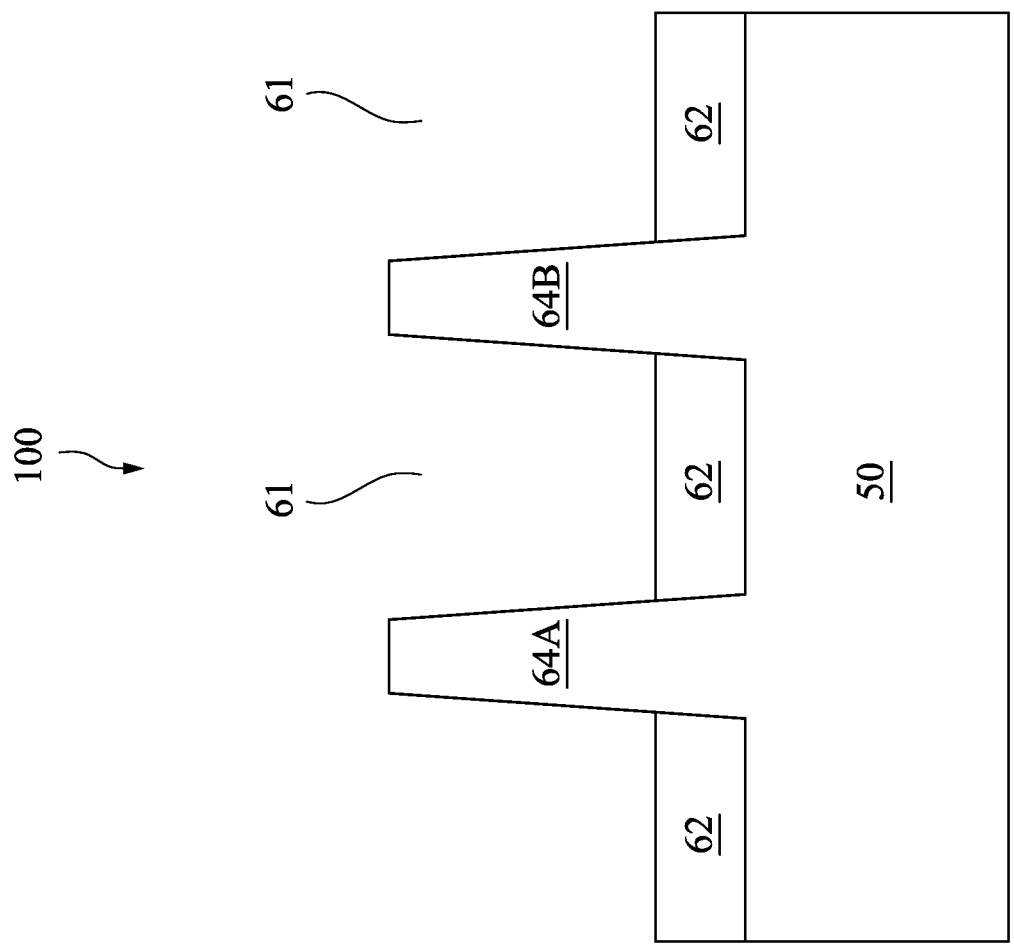

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
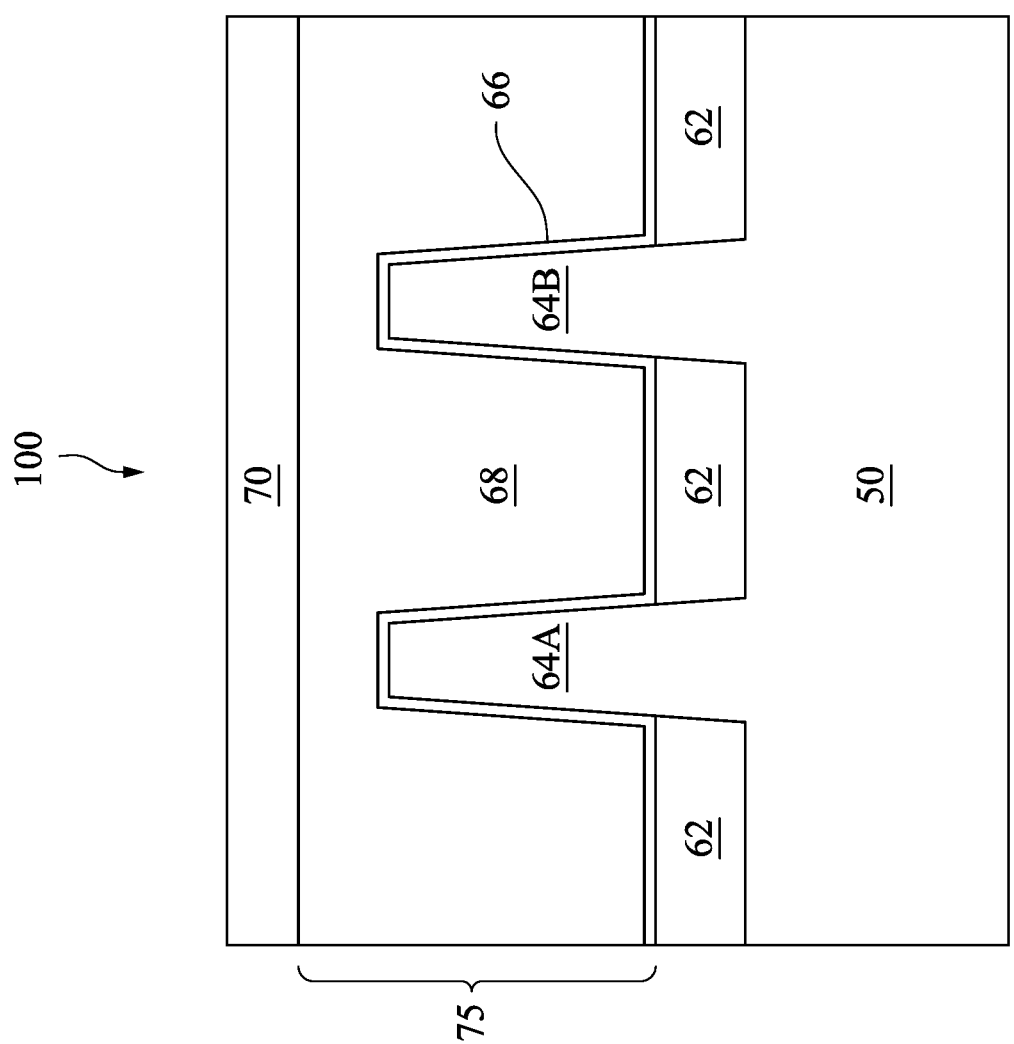

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6, 7A, and 8-15 illustrate the cross-sectional views of further processing of the FinFET device 100 along cross-section A-A (along a longitudinal axis of the fin 64). Note that in FIGS. 6, 7A, and 8, three dummy gate structures 75 (e.g., 75A, 75B, and 75C) are formed over the fin 64. One skilled in the art will appreciate that more or less than three gate structures may be formed over the fin 64, these and other variations are fully intended to be included within the scope of the present disclosure.

Figure 6:
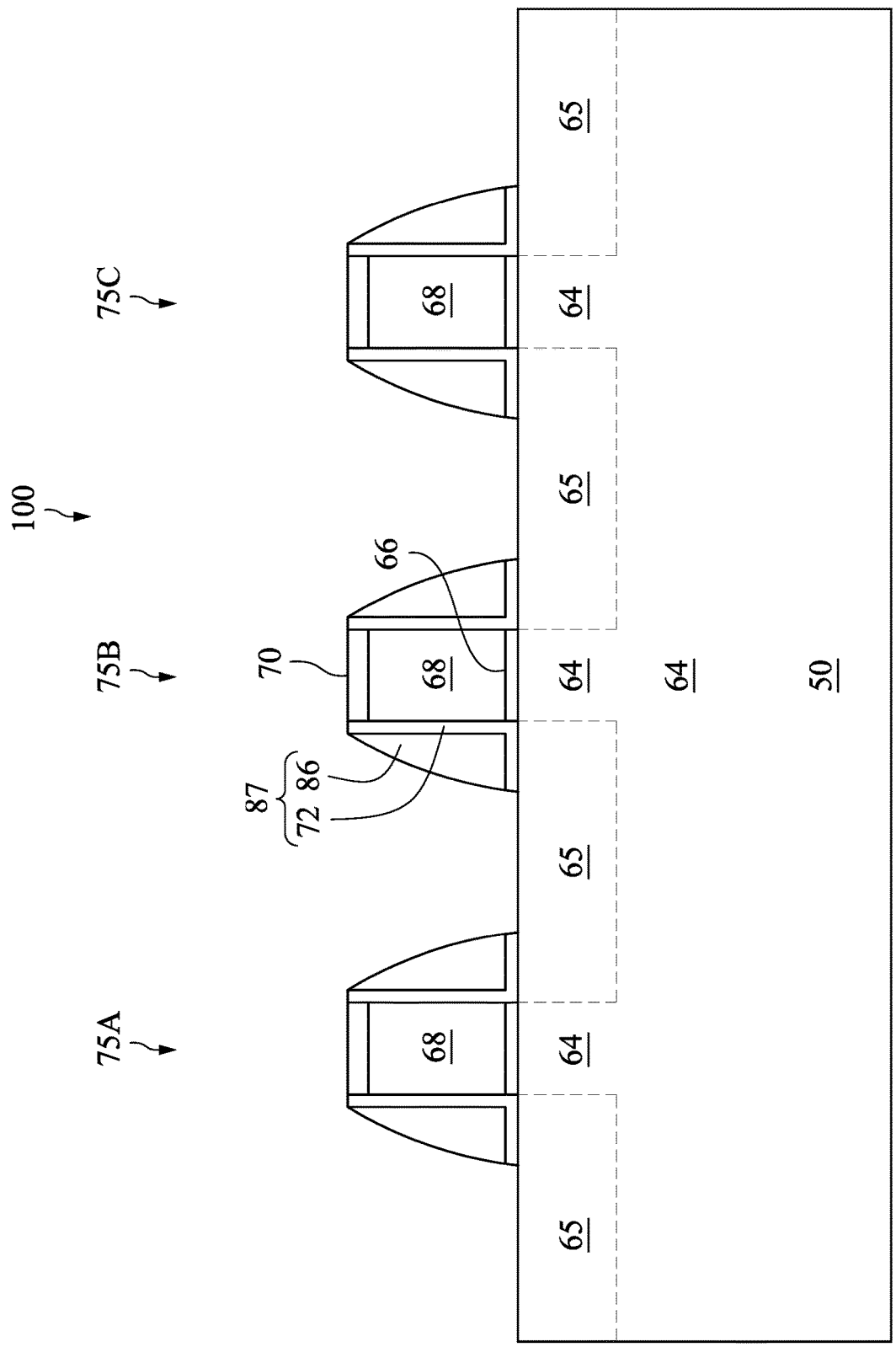

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed. In some embodiments, the LDD regions 65 are omitted. For simplicity, the LDD regions 65 are not illustrated in subsequent figures, with the understanding the LDD regions 65 may be formed in the fin 64.

Still referring to FIG. 6, after the LDD regions 65 are formed, gate spacers 87 are formed around the dummy gate structures 75. The gate spacer 87 may include a first gate spacer 72 and a second gate spacer 86. For example, the first gate spacer 72 may be a gate seal spacer and is formed on opposing sidewalls of the gate electrode 68 and on opposing sidewalls of the gate dielectric 66. The second gate spacer 86 is formed on the first gate spacer 72. The first gate spacer 72 may be formed of a nitride, such as silicon nitride, silicon oxynitride, silicon carbonitride, the like, or a combination thereof, and may be formed using, e.g., a thermal oxidation, CVD, or other suitable deposition process. The second gate spacer 86 may be formed of silicon nitride, silicon carbonitride, a combination thereof, or the like using a suitable deposition method. In an embodiment, the first gate spacer 72 is formed of silicon nitride, and an atomic ratio between silicon and nitrogen (e.g., a ratio between the atomic percentages of silicon and nitrogen) is between about 0.7 and about 1.3.

In an embodiment, the gate spacer 87 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the gate structures. The second portion of the second gate spacer layer remaining after the anisotropic etch process forms the second gate spacer 86. The anisotropic etch process also removes a portion of the first gate spacer layer disposed outside of the sidewalls of the second gate spacer 86, and the remaining portion of the first gate spacer layer forms the first gate spacer 72.

The shapes and formation methods of the gate spacer 87 as illustrated in FIG. 6 are merely non-limiting examples, and other shapes and formation methods are possible. These and other variations are fully intended to be included within the scope of the present disclosure.

Figure 7A:
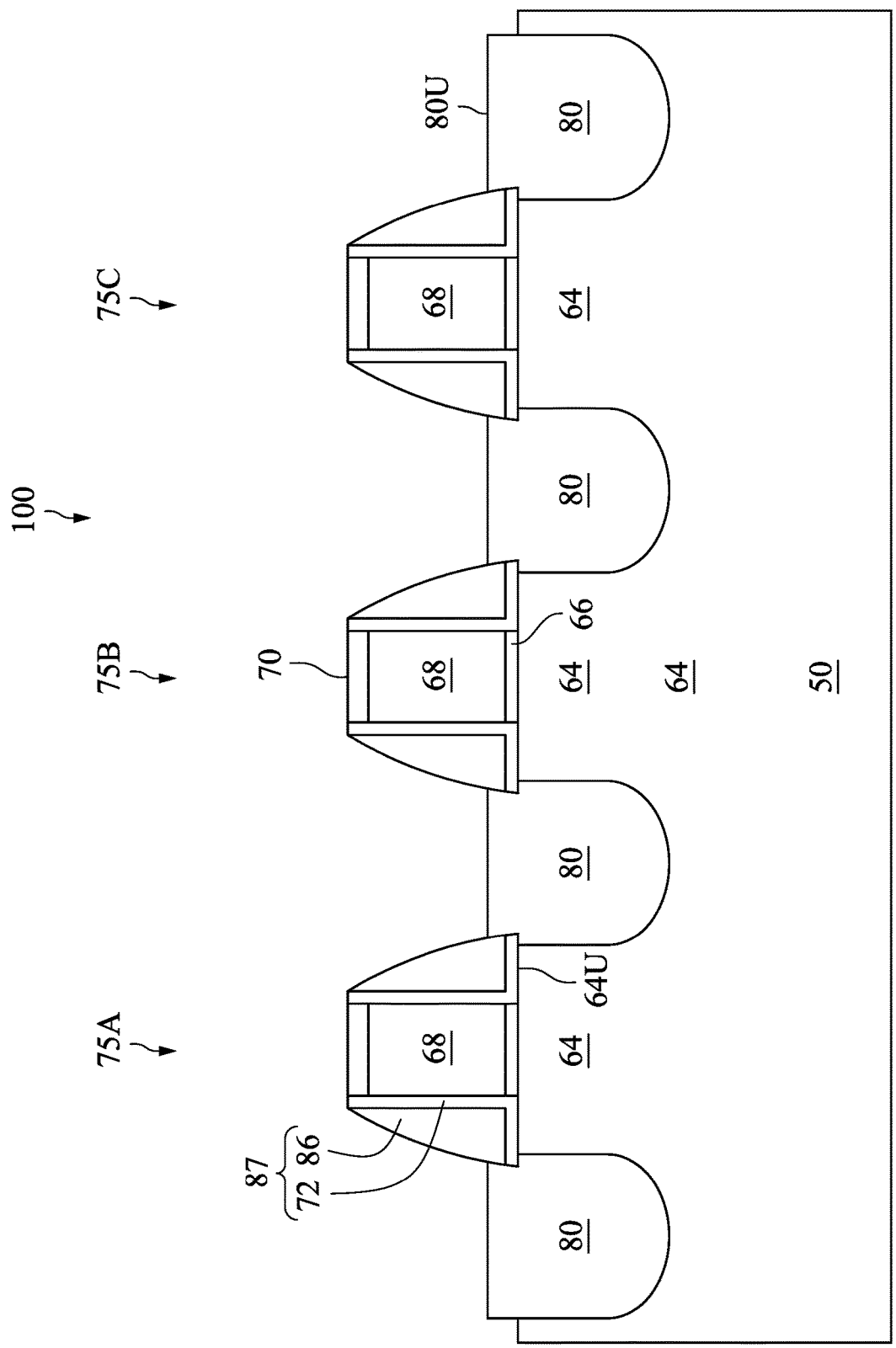
Figure 7B:
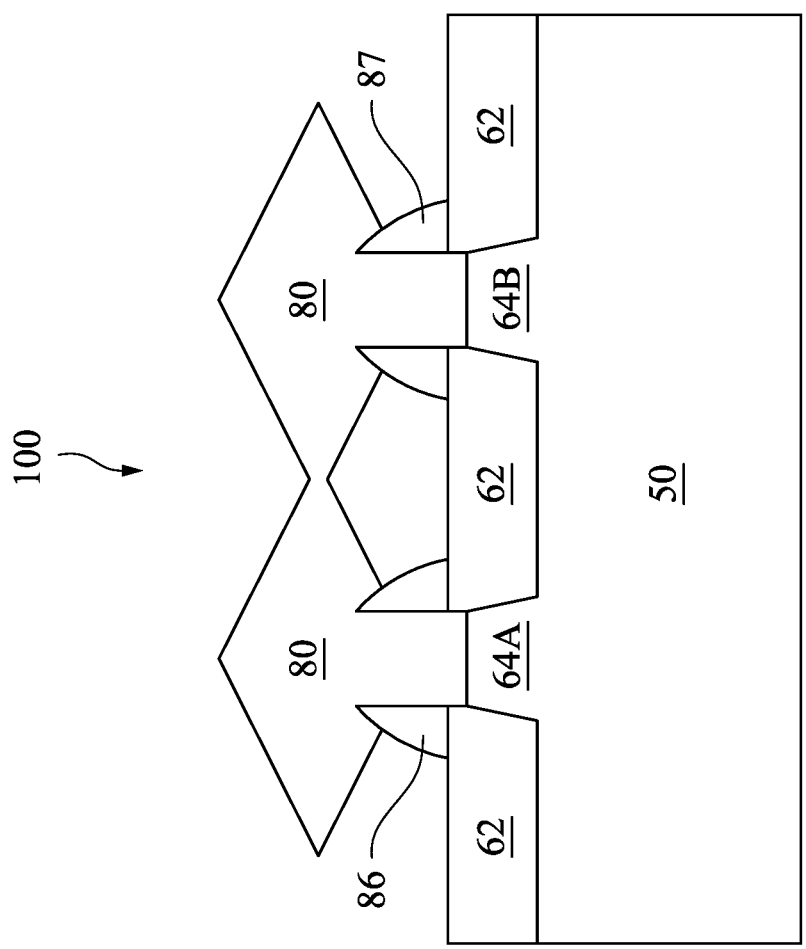
Figure 7C:
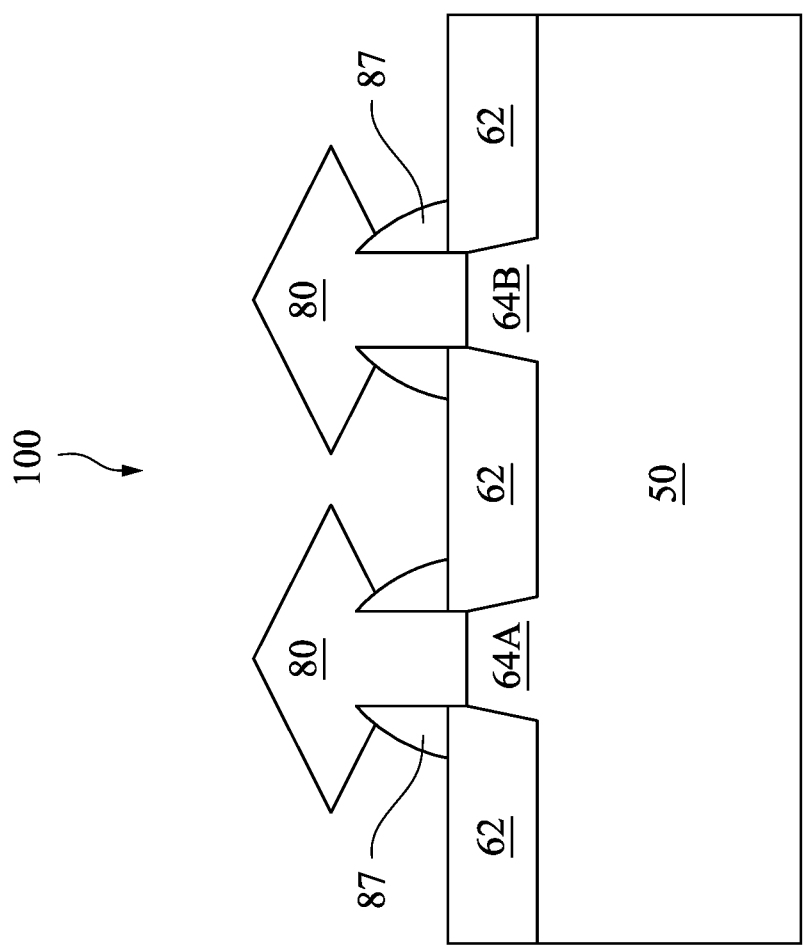

Next, in FIG. 7A, recesses are formed in the fins 64 adjacent to the dummy gate structures 75, e.g., between adjacent dummy gate structures 75 and/or next to a dummy gate structure 75. Source/drain regions 80 are then formed in the recesses. The recesses are formed by, e.g., an anisotropic etching process using the dummy gate structures 75 and the gate spacers 87 as an etching mask, in some embodiments, although any other suitable etching process may also be used.

Next, as illustrated in FIG. 7A, the source/drain regions 80 are formed in the recesses. The source/drain regions 80 are formed by epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7A, the epitaxial source/drain regions 80 may have surfaces raised from respective surfaces of the fins 64 (e.g. raised above the non-recessed upper surface 64U of the fins 64) and may have facets. The source/drain regions 80 of the adjacent fins 64 may merge to form a continuous epitaxial source/drain region 80 (see FIG. 7B). In some embodiments, the source/drain regions 80 of the adjacent fins 64 do not merge together and remain separate source/drain regions 80 (see FIG. 7C). In some embodiments, the resulting FinFET is an n-type FinFET, and source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET device 100 that are to be protected from the implanting process. The source/drain regions 80 may have an impurity (e.g., dopant) concentration in a range from about $1E19$ $cm^{-3}$ to about $1E21$ $cm^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Figure 8:
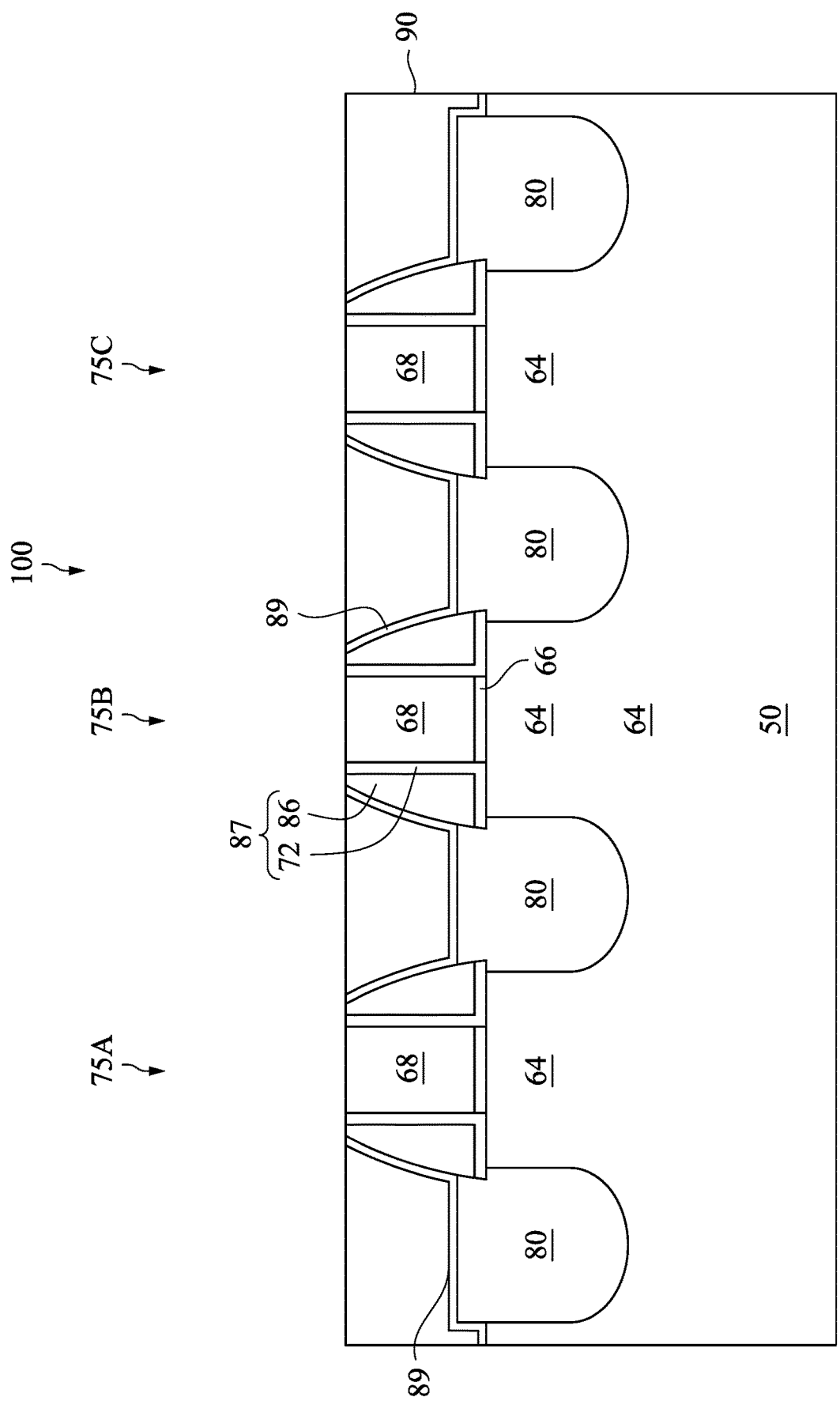

Next, as illustrated in FIG. 8, a contact etch stop layer (CESL) 89 is formed over the structure illustrated in FIG. 7A. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75 (e.g., 75A, 75B, and 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as CMP, may be performed to remove the mask 70 and to remove portions of the CESL 89 disposed over the gate electrode 68. After the planarization process, the top surface of the first ILD 90 is level with the top surface of the gate electrode 68.

Figure 9:
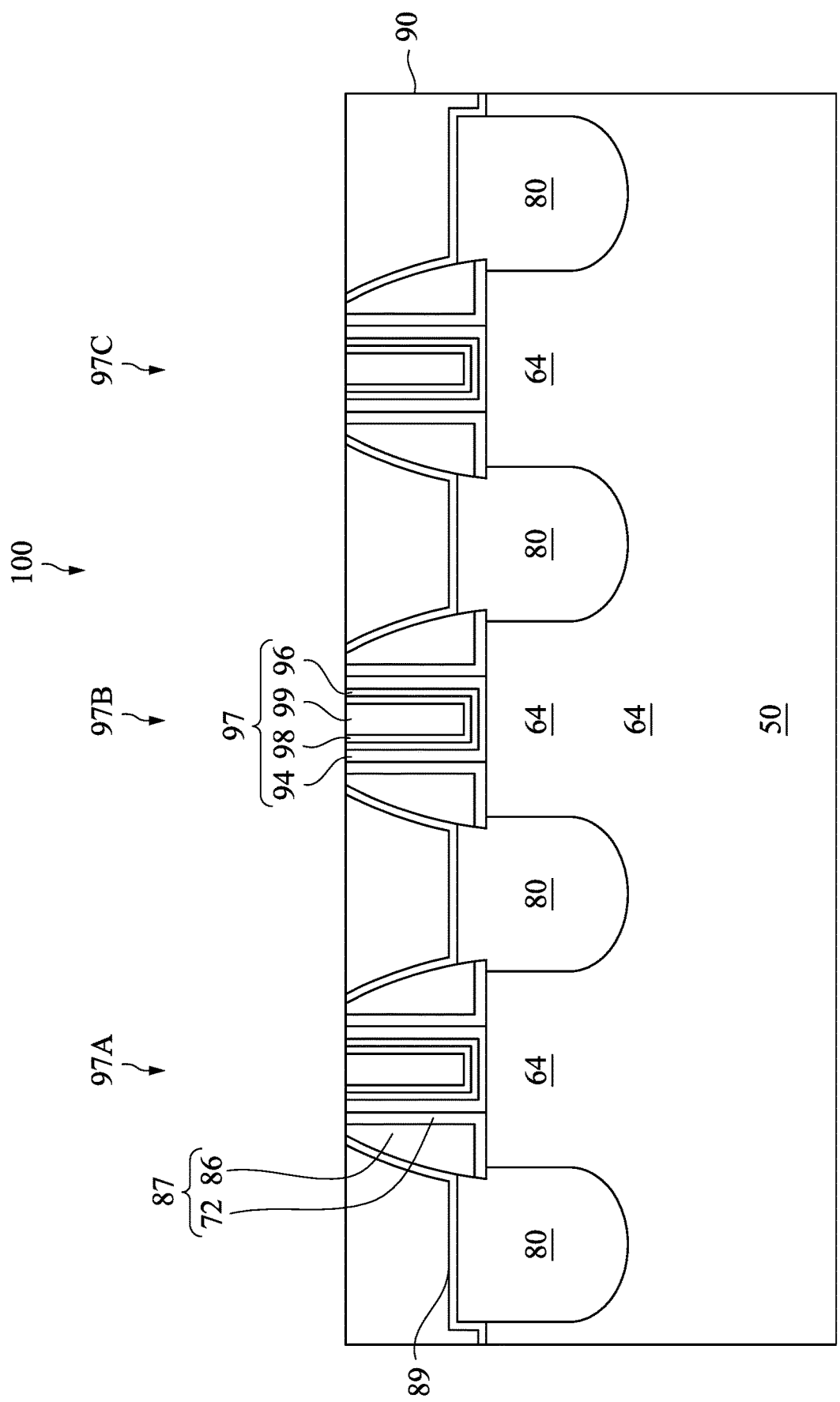

Next, in FIG. 9, a gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process.

Referring to FIG. 9, the dummy gate structures 75A, 75B, and 75C (see FIG. 8) are replaced by replacement gate structures 97A, 97B, and 97C, respectively. The replacement gate structures 97 (e.g., 97A, 97B, and 97C) may also be referred to as metal gate structures. In accordance with some embodiments, to form the replacement gate structures 97 (e.g., 97A, 97B, or 97C), the gate electrode 68 and the gate dielectric 66 directly under the gate electrode 68 are removed in an etching step(s), so that recesses (not shown) are formed between the gate spacers 87. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a work function layer 98, and a gate electrode 99 are formed in the recesses for the replacement gate structures 97. The gate dielectric layer 94 is deposited conformally in the recesses, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as a P-type work function layer or an N-type work function layer, may be formed in the recesses over the barrier layers 96 and before the gate electrode 99 is formed, in some embodiments. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sublayers formed of different materials. For example, the seed layer comprises a titanium layer and a copper layer over the titanium layer.

Next, the gate electrode 99 is deposited over the seed layer, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer 98, the seed layer, and the gate electrode 99, which excess portions are over the top surface of the first ILD 90. The resulting remaining portions of the gate dielectric layer 94, the barrier layer 96, the work function layer 98, the seed layer, and the gate electrode 99 thus form the replacement gate structure 97 of the resulting FinFET device 100.

Figure 10:
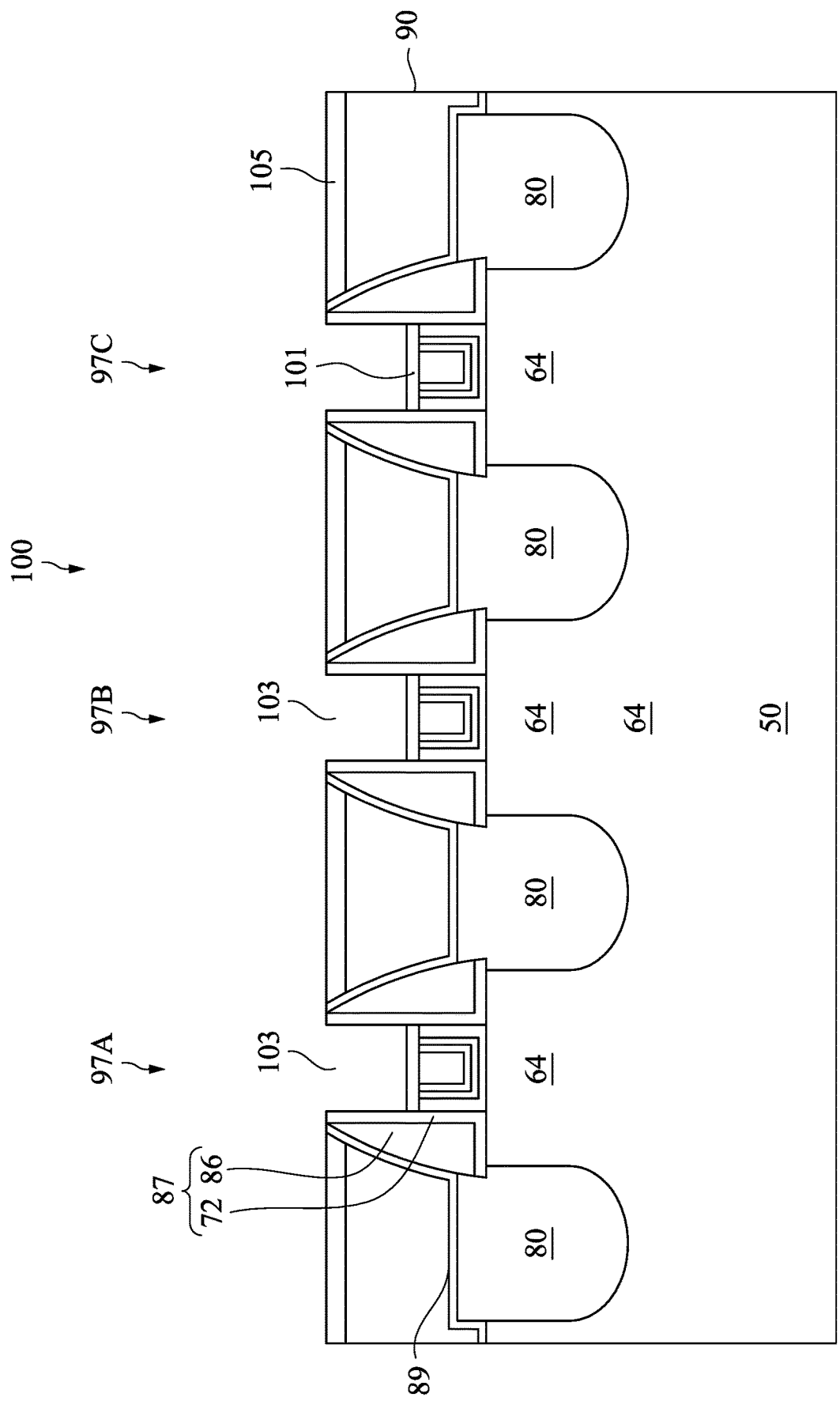

Referring next to FIG. 10, an etch stop layer 105 is formed (e.g., selectively) on the upper surface of the first ILD 90. The etch stop layer 105 may be a suitable dielectric material, such as silicon nitride or silicon oxynitride formed on the upper surface of the first ILD 90 by, e.g., CVD, ALD, combinations thereof, or the like. For example, a patterned mask layer may be formed to cover the replacement gate structures 97 and the gate spacers 87 while exposing the first ILD 90, and the etch stop layer 105 is then formed over the exposed first ILD 90. After the etch stop layer 105 is formed, the patterned mask layer is removed. As another example, an upper layer of the first ILD 90 may be converted into the etch stop layer 105, e.g., by a nitridation process using a nitrogen-containing gas or a nitrogen-containing plasma.

Next, the replacement gate structures 97 are recessed to form recesses 103 between respective gate spacers 87. In some embodiments, a metal gate etch-back process is performed to remove upper portions of the replacement gate structures 97, and as a result, recesses 103 are formed between the gate spacers 87 after the metal gate etch-back process. A suitable etching process, such as dry etch, wet etch, or combinations thereof, may be performed as the metal gate etch-back process.

Still referring to FIG. 10, after the recesses 103 are formed, a capping layer 101 is formed on the recessed replacement gate structures 97. In some embodiments, the capping layer 101 is formed of an electrically conductive material, such as tungsten, using a suitable deposition method, such as ALD, CVD, PVD, or the like. In the example of FIG. 10, the capping layer 101 extends continuously along the upper surface of the replacement gate structure 97 from an inner sidewall of a gate spacer 87 to an opposing inner sidewall of a respective gate spacer 87. In other words, the capping layer 101 completely covers the upper surface of the replacement gate structures 97, in the illustrated embodiment. In some embodiments, the capping layer 101 is omitted.

Figure 11:
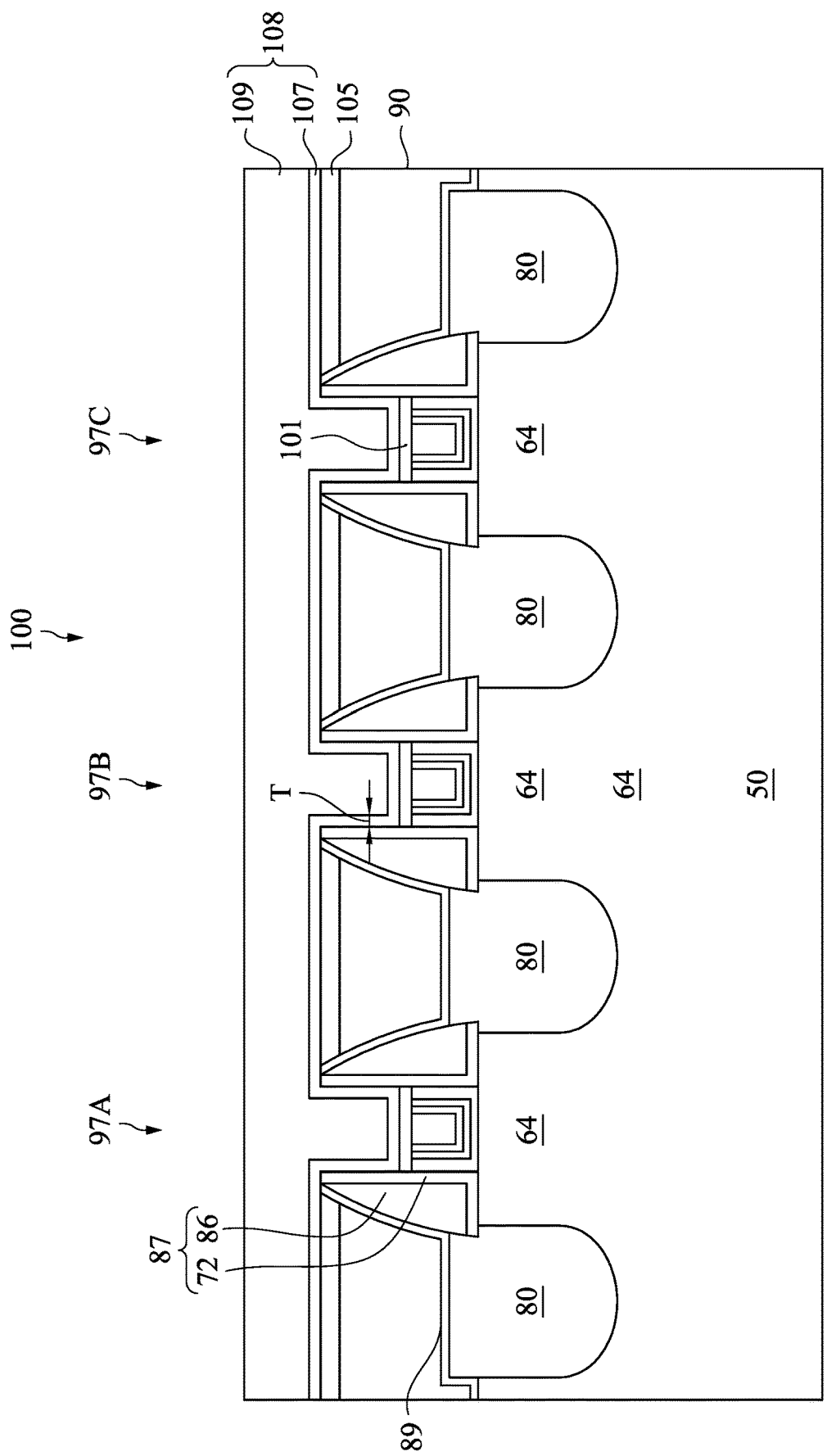

Next, in FIG. 11, the recesses 103 are filled by a hybrid film 108. As illustrated in FIG. 11, a semiconductor material 107 (also referred to as a semiconductor liner) is formed conformally along sidewalls and bottoms of the recesses 103, and along the upper surface of the etch stop layer 105. Next, a dielectric material 109 is formed over the semiconductor material 107 to fill the recesses 103. The dielectric material 109 may also be formed outside the recesses 103 over portions of the semiconductor material 107 between replacement gate structures 97. The semiconductor material 107 and the dielectric material 109 are collectively referred to as a hybrid film 108.

In an example embodiment, the semiconductor material 107 is amorphous silicon (a-Si) formed by a suitable deposition process such as LPCVD, PECVD, ALD, or the like, using a silicon-containing process gas such as $SiH_4$, $Si_2H_6$, $SiH_2Cl_2$, combinations thereof, or the like. A flow rate of the process gas may be between about 50 standard cubic centimeters per minute (sccm) and about 1000 sccm. A pressure of the deposition process may be between about 0.1 torr and about 10 torr, and a temperature of the deposition process may be between about 300° C. and about 500° C. A thickness T of the semiconductor material 107 is between about 0.3 nm and about 5 nm (e.g., 0.3 nm<T<5 nm), in an embodiment. An atomic percentage (at %) of hydrogen in the semiconductor material 107 is less than about 15 at % (e.g., H<15 at %), in an embodiment. In the discussion herein, the conformal semiconductor material 107 may also be referred to as a silicon liner, with the understanding that other suitable material may also be used as the semiconductor material 107.

In an example embodiment, the dielectric material 109 is silicon nitride formed by a suitable formation method, such as ALD, PECVD, LPCVD, or the like. A atomic ratio between silicon and nitrogen (e.g., Si:N atomic ratio) in the dielectric material 109 is between about 0.7 and about 1.3. Besides silicon nitride (e.g., SiN), other suitable dielectric material, such as silicon carbon nitride (SiCN), silicon carbon oxynitride (SiCON), and silicon carbon oxide (SiCO), may also be used as the dielectric material 109. In some embodiments, the dielectric material 109 is chosen to be different from the material(s) of the gate spacers 87 to provide etching selectivity in subsequent etching processes, such as the etching process to form openings 121 (see FIG. 13).

The as-deposited semiconductor material 107 may (or may not) include some crystalline structures such as polycrystalline structures, which include grains therein. Some grains may be connected to each other, while some other grains may be buried in amorphous structures. The copper in, e.g., the gate electrode 99 may diffuse upward along the grain boundaries to overlying layers that will be formed subsequently. Therefore, to reduce the upward diffusion of copper, after the deposition of the semiconductor material 107, a treatment process (also referred to as an amorphization process) is performed to convert the polycrystalline structures (if any) in the semiconductor material 107 into amorphous structures, so that the entire semiconductor material 107 is amorphous. Since amorphous semiconductor material 107 does not have grain boundaries, it has better ability to prevent copper from diffusing through. The treatment process is performed after the semiconductor material 107 is formed and before the dielectric material 109 is formed, in some embodiments.

In accordance with some embodiments, the treatment process (e.g., a plasma process) for the as-deposited semiconductor material 107 is performed using a process gas comprising NH3, N2, or combination thereof. Other gases, such as argon, may also be added. In the treatment process, the semiconductor material 107 is bombarded. The bombardment destroys the crystalline structures. In addition, with hydrogen and nitrogen atoms being in the process gas (e.g., NH3), hydrogen and nitrogen may be added into the semiconductor material 107. Accordingly, the semiconductor material 107 may comprise hydrogen doped therein as a result of the treatment process. In accordance with some embodiments, after the amorphization process, the semiconductor material 107 has a hydrogen atomic percentage in the range between about 0.5 at % and about 10 at %.

In accordance with some embodiments, the treatment process is or comprises a plasma treatment, which may be a direct plasma process, with the plasma being generated in the same process chamber where the FinFET device 100 is treated. The plasma treatment process is performed using both a High-Frequency Radio-Frequency (HFRF) power (e.g., with a frequency about 13.56 MHz) and a Low-Frequency Radio-Frequency (LFRF) power (e.g., with a frequency of about 350 KHz). The HFRF power is used for ionization and to generate plasma, and the LFRF power is used for bombarding the semiconductor material 107 for amorphization purpose. In accordance with some embodiments of the present disclosure, the HFRF power is in the range between about 50 watts and about 2000 watts.

The LFRF power is selected to be in a suitable range. If the LFRF power is too low (e.g., lower than about 90 watts), the amorphization process may not be effective. If the LFRF power is too high (e.g., higher than about 135 watts), there may be severe plasma-induced damage to layer/structures underlying the semiconductor material 107. In accordance with some embodiments of the present disclosure, the LFRF power is selected to be in the range between about 90 watts and about 135 watts to avoid the aforementioned issues.

Figure 12:
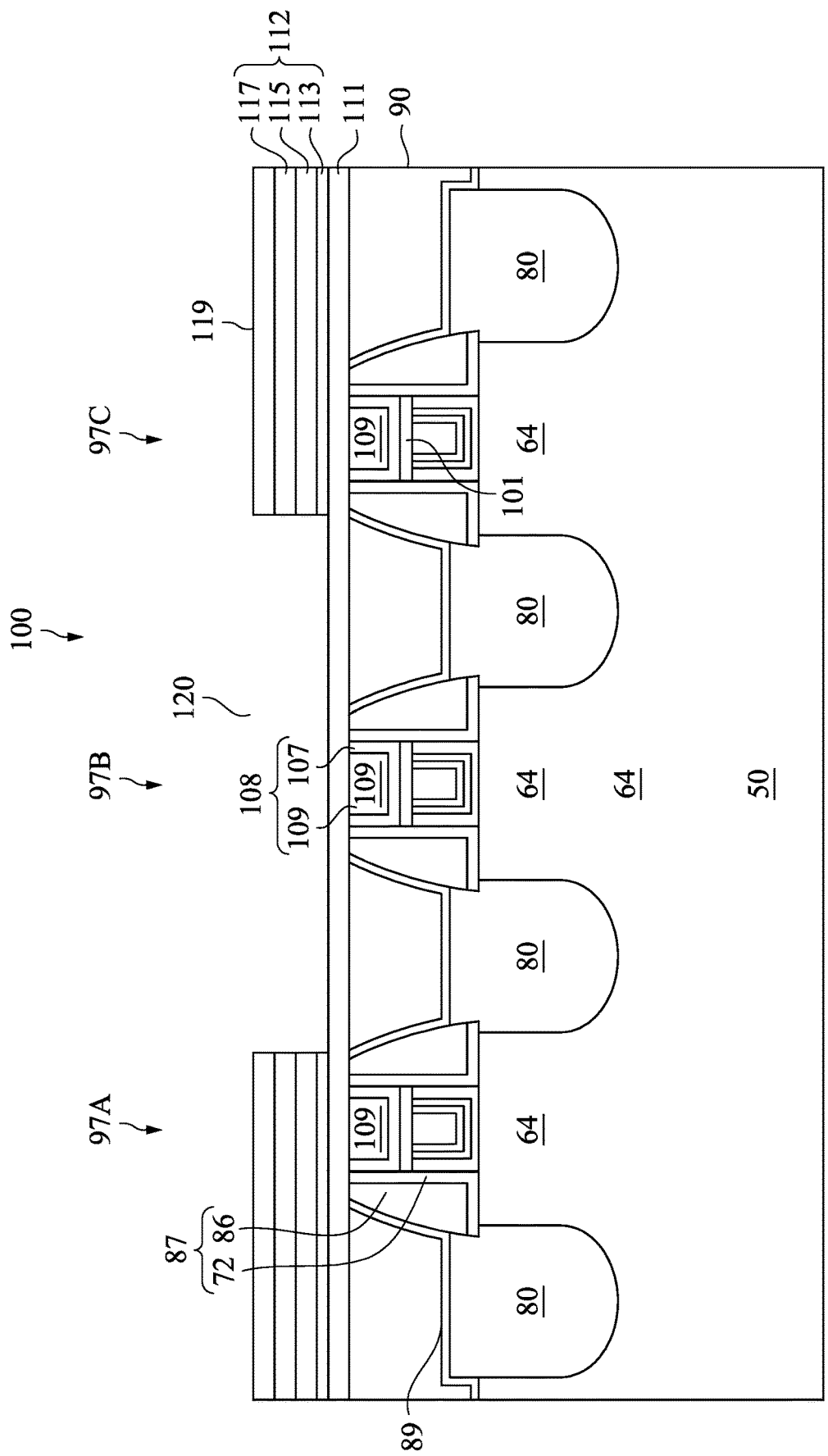

Next, in FIG. 12, a planarization process, such as CMP, is performed to remove excess portions of the semiconductor material 107 and excess portions of the dielectric material 109, which excess portions are over the upper surface of the first ILD 90. As illustrated in FIG. 12, the planarization process also remove the etch stop layer 105 and top portions of the gate spacers 87. After the planarization process, the remaining portions of the semiconductor material 107 and the dielectric material 109 disposed between (remaining portions of) respective gate spacers 87 are referred to as hybrid film structures 108.

Next, a second ILD 111 is formed over the first ILD 90, the gate spacers 87, and the hybrid film structures 108. The second ILD 111 may be formed of a same or similar material using a same or similar formation method as the first ILD 90, thus details are not repeated. The second ILD 111 may serve as an etch stop layer in a subsequent etching process.

Next, an etch stop layer stack 112 is formed over the second ILD 111 and patterned to have an opening 120 in the etch stop layer stack 112. In some embodiments, the etch stop layer stack 112 includes a plurality of layers (also referred to as sublayers), where each of the plurality of layers is formed of a different material. In the example of FIG. 12, the etch stop layer stack 112 includes a first layer 113, a second layer 115, and a third layer 117 formed successively over the second ILD 111. The first layer 113 is formed of tungsten doped carbide (WDC, also known as tungsten doped silicon carbide), the second layer 115 is formed of an oxide (e.g., silicon oxide), and the third layer 117 is formed of silicon (e.g. Si). The different materials of the sublayers of the etch stop layer stack 112 combine to provide a target level of etching selectivity for, e.g., the subsequent etching process to form openings 121 in FIG. 13.

Next, the etch stop layer stack 112 is patterned to form an opening 120 in the etch stop layer stack 112. For example, a patterned mask layer 119 (e.g., a patterned photoresist layer) is formed over the etch stop layer stack 112, and an anisotropic etching process is then performed using the patterned mask layer 119 as an etching mask to pattern the patterned mask layer 119. The number and the location of the opening 120 in FIG. 12 is merely a non-limiting example. One skilled in the art will readily appreciate that other numbers of openings 120 may be formed at other locations. In some embodiments, the anisotropic etching process includes a plurality of etching steps, where each of the etching steps uses a different etchant to selectively remove a sublayer of the etch stop layer stack 112. The anisotropic etching process may stop when the second ILD 111 is exposed. The patterned mask layer 119 (e.g., a patterned photoresist layer) may be removed after the opening 120 is formed, e.g., by an ashing process.

Figure 13:
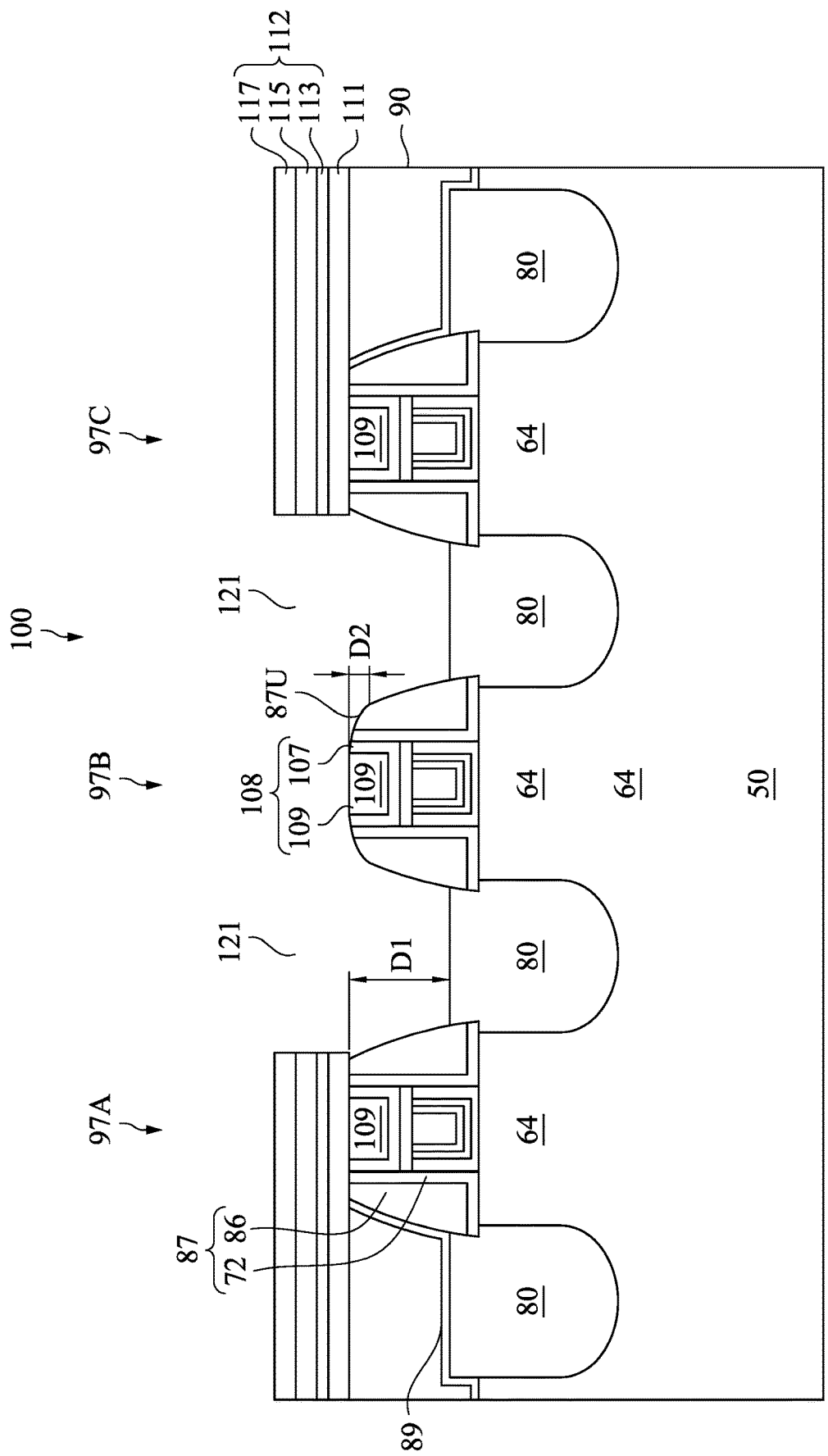

Next, in FIG. 13, an etching process is performed to remove portions of the second ILD 111 and portions of the first ILD 90 underlying the opening 120. After the etching process, openings 121 are formed in the first ILD 90 that expose the underlying source/drain regions 80. A depth D1 of the opening 121 may be between about 20 nm and about 80 nm, as an example. The etching process may be any suitable etching process, such as a dry etch (e.g., a plasma etching process), a wet etch, combinations thereof, or the like. The etching process may use an etchant that is selective to (e.g., having a higher etching rate for) the material (e.g., oxide) of the first ILD 90 and the second ILD 111, such that the first ILD 90 and the second ILD 111 are removed without substantially attacking other layers of the FinFET device 100. For example, an etching processing using $C_xF_y$, $H_2$, Ar, combinations thereof, or the like may be performed to remove the exposed portions of the first ILD 90 and the second ILD 111. In some embodiments, after the etching process to remove the exposed portions of the first ILD 90 and the second ILD 111, another etching process using an etchant selective to the material of the CESL 89 is performed to remove the CESL 89 exposed by the openings 121 and to expose the source/drain regions 80. Note that the portions of the first ILD 90/second ILD 111 underlying the opening 120 are completely removed in preparation for forming self-aligned contacts (SAC) 123 (see FIG. 14).

In some embodiments, the etching process to form the openings 121 also removes top portions of the gate spacers 87 and top portions of the hybrid film structure 108 underlying the opening 120 in FIG. 12. However, the hybrid film structure 108, with its unique structure, dimension (e.g., 0.3 nm<T<5 nm) and material composition (e.g., atomic percentage of H<15 at %, and the atomic ratio of Si:N between 0.7 and 1.3), provides good etching selectivity in the etching process to form the openings 121, such that the hybrid film structure 108 is etched at a slower rate than the gate spacers 87. In other words, the etching process to form the opening 121 recesses the hybrid film structure 108 less than the gate spacers 87. In the example of FIG. 13, after the etching process is finished, the upper surface 87U of the gate spacer 87 is slopped (e.g. slanted). For example, there is an offset D2 between an uppermost edge of the upper surface 87U (which may be level with the upper surface of the hybrid film structure 108) and a lowermost edge of the upper surface 87U. The offset D2 may be, e.g., 10 nm or less. The unintended removal (e.g., etching) of the hybrid film structure 108 and the gate spacer 87 is referred to as chopping effect.

The current disclosure embodiment, by using the hybrid film structure 108, among other features, reduces the chopping effect significantly, which in turn reduces product defect related with the chopping effect. To appreciate the advantage of the present disclosure, consider a reference design where the hybrid film structure 108 is replaced by a single layer of dielectric material (e.g., silicon nitride). In other words, in the reference design, a single silicon nitride layer is formed over the replacement gate structure 97 and fills the space between respective gate spacers 87. The chopping effect would remove significant portions of the single silicon nitride layer and the gate spacers 87. In subsequent processing to fill the openings 121 with a conductive material to form self-aligned contacts 123, the conductive material may fill spaces left by the removed portions of the single silicon nitride layer and the gate spacers 87, which may result in short circuit (e.g., unintended electrical connection) between the replacement gate structure 97 and the source/drain region 80, or between the source/drain regions 80 on opposing sides of the replacement gate structure 97. The current disclosure avoids or reduces the short-circuit defects caused by the chopping effect. The current disclosed structure and method have been implemented and tested in production, and measurements have confirmed that chopping effect induced short-circuit defects have been reduced by four orders of magnitude.

Figure 14:
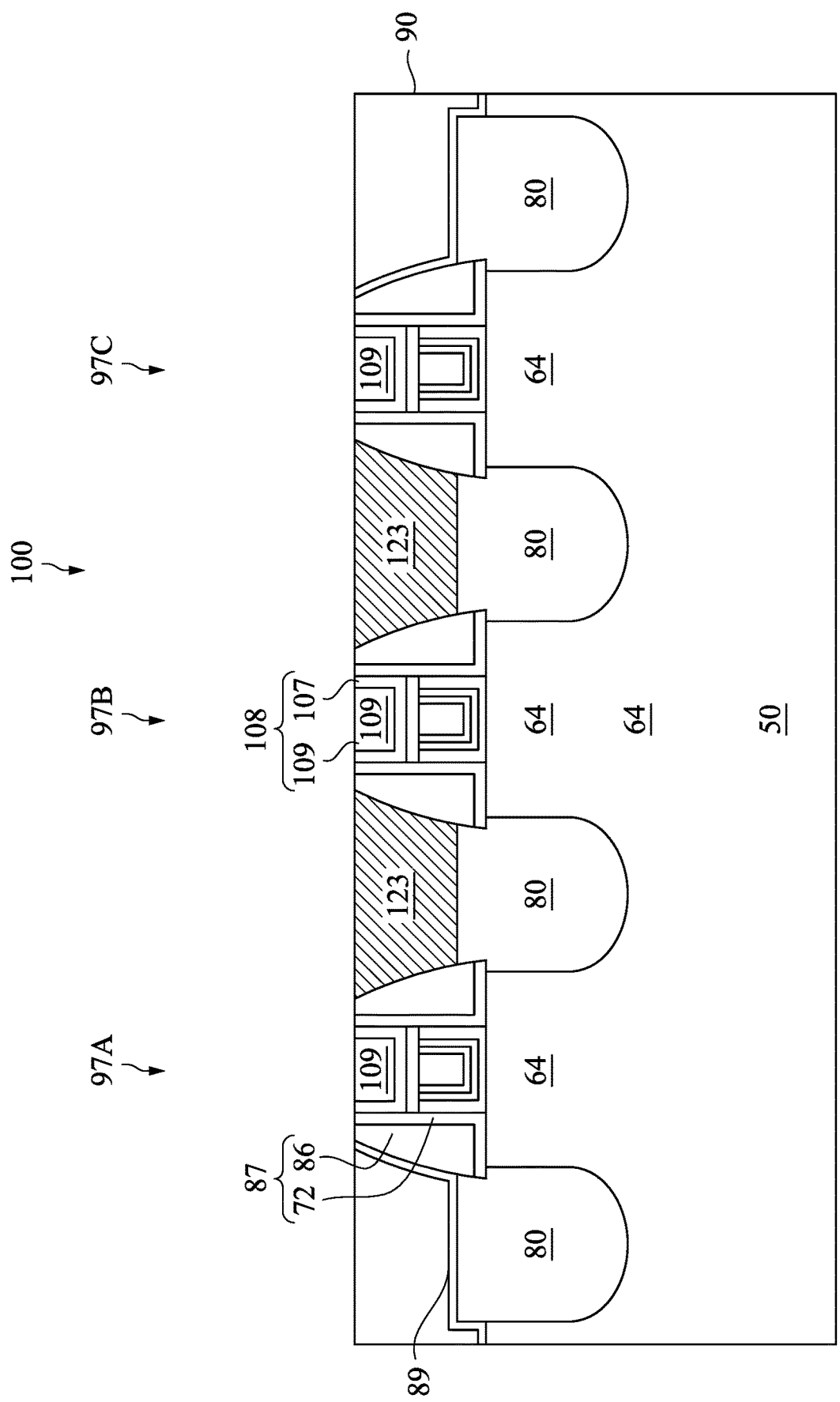

Next, in FIG. 14, a conductive material is formed in the openings 121 to fill the openings 121. The conductive material may be copper, cobalt, tungsten, combinations thereof, or the like, and may be formed by a suitable formation method such as PVD, CVD, PECVD, ALD, or the like. Next, a planarization process, such as CMP, is performed to remove the etch stop layer stack 112 and the second ILD 111. The remaining portions of the conductive material in the openings 121 form self-aligned contacts 123. As illustrated in FIG. 14, after the planarization process, the first ILD 90, the hybrid film structure 108, the gate spacers 87, and the self-aligned contacts 123 have a coplanar upper surface.

Figure 15:
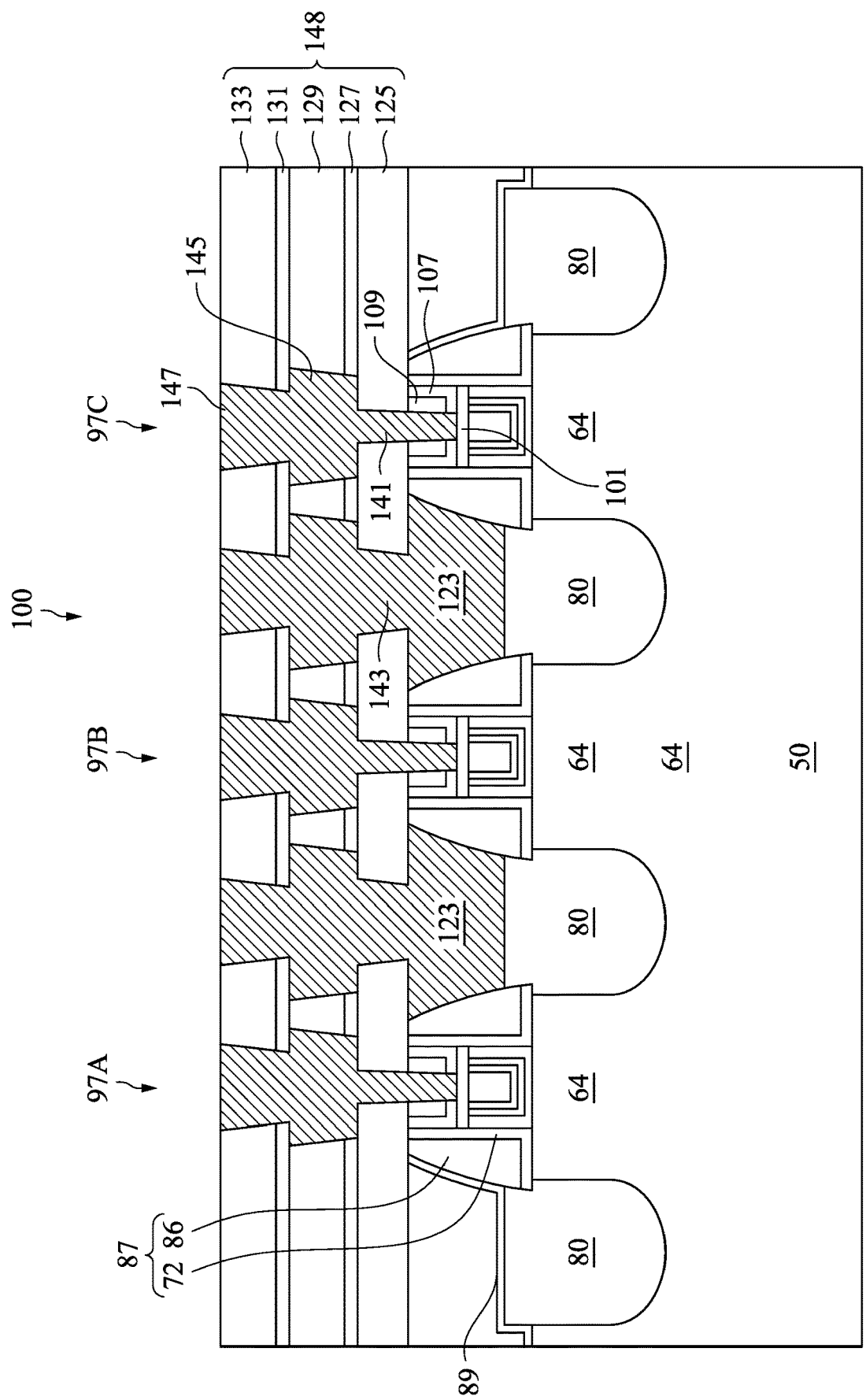

Next, in FIG. 15, an interconnect structure 148 is formed over the first ILD 90 to interconnect the underlying electrical components (e.g., the FinFETs) to form functional circuits. The interconnect structure 148 includes a plurality of dielectric layers (e.g., 125, 129, 133) and conductive features (e.g., 141, 143, 145, 147) formed in the plurality of dielectric layers. Note that in the description herein, unless otherwise specified, conductive features and conductive materials refer to electrically conductive features and electrical conductive materials, respectively.

The dielectric layers 125/129/133 may also be referred to as inter-metal dielectric (IMD) layers. The IMD layers 125/129/133 may be formed of one or more suitable dielectric materials such as silicon oxide, silicon nitride, low-k dielectrics such as carbon doped oxides, extremely low-k dielectrics such as porous carbon doped silicon dioxide, combinations of these, or the like. The IMD layers 125/129/133 may be formed through a process such as chemical vapor deposition (CVD), although any suitable process may be utilized. Etch stop layers 127 and 131 may be formed between adjacent IMD layers. The etch stop layers 127 and 131 may be formed of silicon nitride using PECVD, although other dielectric materials such as nitride, carbide, boride, combinations thereof, or the like, and alternative techniques of forming the etch stop layers, such as LPCVD, PVD, or the like, could alternatively be used.

In FIG. 15, gate contacts 141 are formed to extend through the IMD layer 125, the dielectric material 109, and the semiconductor material 107 to electrically couple to the replacement gate structures 97, e.g., through the capping layer 101. In the example of FIG. 15, the lower surface of the gate contact 141 physically contacts and extends along the upper surface of the underlying capping layer 101. In addition, source/drain contacts 143 are formed to extend through the IMD layer 125 to electrically couple to the self-aligned contacts 123. FIG. 15 further illustrates conductive lines 145 and vias 147 formed in IMD layers 129 and 133, respectively. The gate contacts 141, source/drain contacts 143, conductive lines 145, and via 147 are formed of one or more conductive materials (e.g., copper, tungsten, cobalt), and may be formed using any suitable method, such as damascene, dual-damascene, or the like. Note that the number and the location of the conductive features in the interconnect structure 148 are for illustration purpose only and not limiting. Other conductive features at other locations may be formed. In addition, some conductive features formed may not be in the cross-section of FIG. 15, thus are not visible (e.g., shown) in FIG. 15.

Figure 16:
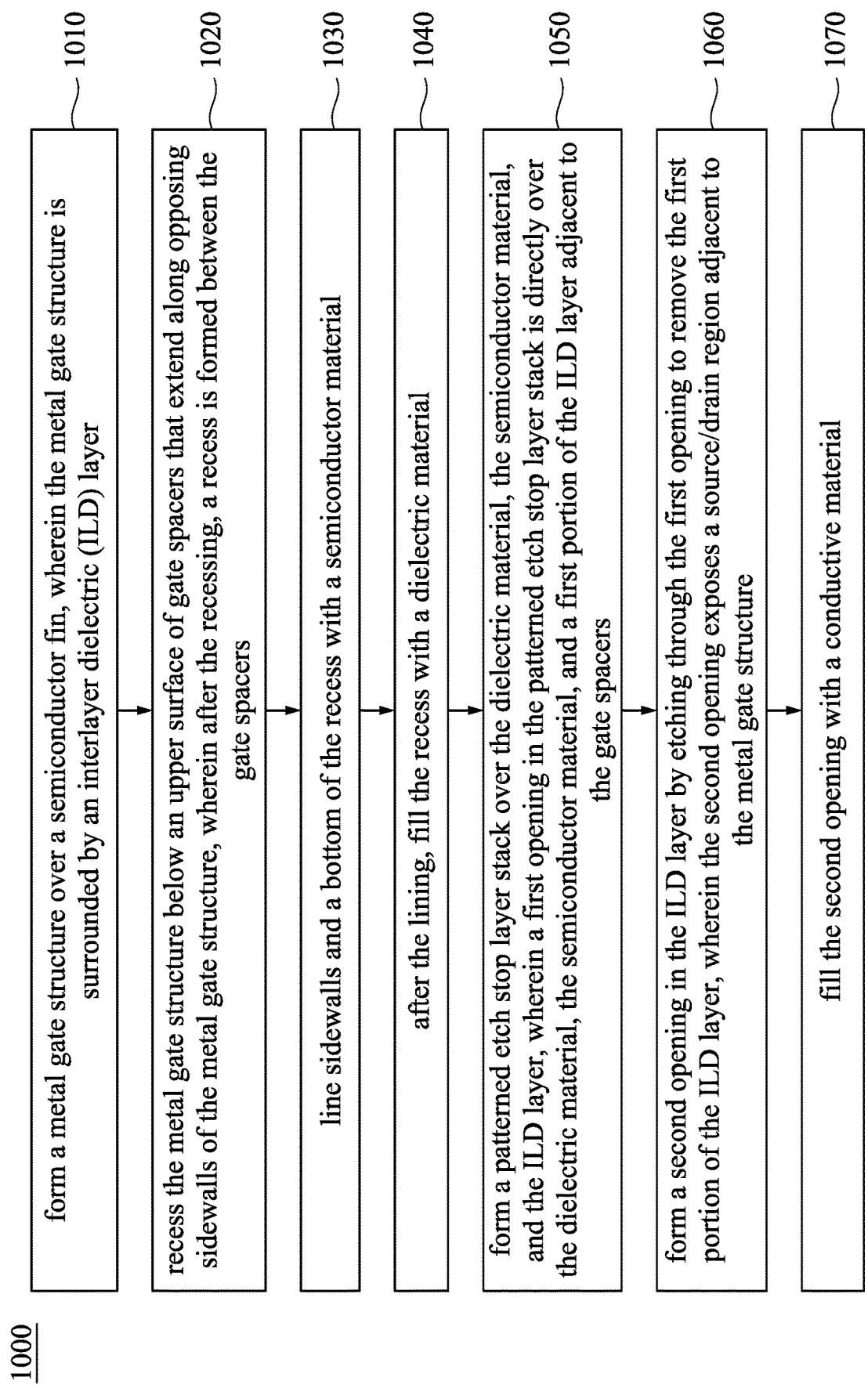
FIG. 16 illustrates a flow chart of method of forming a semiconductor device, in accordance with some embodiments.

FIG. 16 illustrates a flow chart of a method 1000 of forming a semiconductor device, in accordance with some embodiments. It should be understood that the embodiment method shown in FIG. 16 is merely an example of many possible embodiment methods. One of ordinary skill in the art would recognize many variations, alternatives, and modifications. For example, various steps as illustrated in FIG. 16 may be added, removed, replaced, rearranged and repeated.

Referring to FIG. 16, at block 1010, a metal gate structure is formed over a semiconductor fin, wherein the metal gate structure is surrounded by an interlayer dielectric (ILD) layer. At block 1020, the metal gate structure is recessed below an upper surface of gate spacers that extend along opposing sidewalls of the metal gate structure, wherein after the recessing, a recess is formed between the gate spacers. At block 1030, sidewalls and a bottom of the recess are lined with a semiconductor material. At block 1040, after the lining, the recess is filled with a dielectric material. At block 1050, a patterned etch stop layer stack is formed over the dielectric material, the semiconductor material, and the ILD layer, wherein a first opening in the patterned etch stop layer stack is directly over the dielectric material, the semiconductor material, and a first portion of the ILD layer adjacent to the gate spacers. At block 1060, a second opening is formed in the ILD layer by etching through the first opening to remove the first portion of the ILD layer, wherein the second opening exposes a source/drain region adjacent to the metal gate structure. At block 1070, the second opening is filled with a conductive material.

Embodiments may achieve advantages. For example, the disclosed structure and method reduces chopping effect, thereby preventing or reducing device defect due to short-circuit caused by the chopping effect. Measurements have confirmed that chopping effect induced defect rate has been reduced by four orders of magnitude in production by using the disclosed structure and method.

In accordance with an embodiment, a method of forming a semiconductor device includes: forming a metal gate structure over a semiconductor fin, wherein the metal gate structure is surrounded by an interlayer dielectric (ILD) layer; recessing the metal gate structure below an upper surface of gate spacers that extend along opposing sidewalls of the metal gate structure, wherein after the recessing, a recess is formed between the gate spacers; lining sidewalls and a bottom of the recess with a semiconductor material; after the lining, filling the recess with a dielectric material; forming a patterned etch stop layer stack over the dielectric material, the semiconductor material, and the ILD layer, wherein a first opening in the patterned etch stop layer stack is directly over the dielectric material, the semiconductor material, and a first portion of the ILD layer adjacent to the gate spacers; forming a second opening in the ILD layer by etching through the first opening to remove the first portion of the ILD layer, wherein the second opening exposes a source/drain region adjacent to the metal gate structure; and filling the second opening with a conductive material. In an embodiment, the semiconductor material is amorphous silicon. In an embodiment, the dielectric material is silicon nitride. In an embodiment, the method further includes, before recessing the metal gate structure, selectively forming an etch stop layer over an upper surface of the ILD layer distal from the semiconductor fin, wherein a first portion of the semiconductor material contacts and extends along the etch stop layer. In an embodiment, the method further includes, after filling the recess and before forming the patterned etch stop layer stack, performing a planarization process, wherein the planarization process removes the first portion of the semiconductor material and the etch stop layer. In an embodiment, the method further includes, after the recessing and before the lining, forming a capping layer over the metal gate structure, wherein the capping layer physically contacts the metal gate structure and the semiconductor material. In an embodiment, forming the second opening comprises performing an etching process to remove the first portion of the ILD layer, wherein the etching process recesses the gate spacers more than the dielectric material and the semiconductor material. In an embodiment, forming the patterned etch stop layer stack comprises: forming an etch stop layer stack by forming a first sublayer, a second sublayer, and a third sublayer successively over the ILD layer, wherein the first sublayer, the second sublayer, and the third sublayer comprise different materials; forming a patterned mask layer over the etch stop layer stack; and patterning the etch stop layer stack using the patterned mask layer as an etching mask. In an embodiment, the first sublayer is formed of tungsten doped silicon carbide, the second sublayer is formed of silicon oxide, and the third sublayer is formed of silicon. In an embodiment, the method further includes, after filling the second opening: removing the patterned etch stop layer stack; forming an inter-metal dielectric (IMD) layer over the ILD layer; and forming a first via and a second via that extend through the IMD layer, wherein the first via further extends through the dielectric material and the semiconductor material and is electrically coupled to the metal gate structure, wherein the second via is electrically coupled to the conductive material.

In accordance with an embodiment, a method of forming a semiconductor device includes: forming a first metal gate structure over a fin; forming a second metal gate structure over the fin and adjacent to the first metal gate structure, wherein the first metal gate structure and the second metal gate structure are surrounded by an interlayer dielectric (ILD) layer; recessing the first metal gate structure and the second metal gate structure to form a first opening between first gate spacers and to form a second opening between second gate spacers, respectively, wherein the first gate spacers are on opposing sidewalls of the first metal gate structure, and the second gate spacers are on opposing sidewalls of the second metal gate structure; conformally forming a semiconductor material along sidewalls and bottoms of the first opening and the second opening; filling the first opening and the second opening by forming a dielectric material on the semiconductor material; and forming a self-aligned contact between the first metal gate structure and the second metal gate structure, wherein the self-aligned contact is electrically coupled to an underlying source/drain region between the first metal gate structure and the second metal gate structure. In an embodiment, forming the self-aligned contact comprises, after filling the first opening and the second opening: forming an etch stop layer stack over the ILD layer, wherein the etch stop layer stack comprises a plurality of layers, each of the plurality of layers being formed of a different material; forming a first opening in the etch stop layer stack over the first metal gate structure and over a first portion of the ILD layer between the first metal gate structure and the second metal gate structure; removing the first portion of the ILD layer to form a second opening in the ILD layer, wherein the second opening exposes the underlying source/drain region; and filling the second opening with a conductive material, wherein the conductive material extends continuously from the first metal gate structure to the second metal gate structure. In an embodiment, forming the etch stop layer stack comprises: forming a first layer of tungsten doped silicon carbide over the ILD layer; forming a second layer of silicon oxide over the first layer; and forming a third layer of silicon over the second layer. In an embodiment, the semiconductor material is amorphous silicon, and the dielectric material is silicon nitride. In an embodiment, the method further includes, after the recessing and before conformally forming the semiconductor material, forming a conductive capping layer on the first metal gate structure and on the second metal gate structure. In an embodiment, the conductive material contacts and extends along an upper surface of the conductive capping layer distal from the fin.

In accordance with an embodiment, a method of forming a semiconductor device includes: forming a fin protruding above a substrate; forming a metal gate over the fin, wherein the metal gate is surround by a dielectric layer; etching the metal gate to reduce a height of the metal gate, wherein after the etching, a recess is formed over the metal gate between gate spacers of the metal gate; lining sidewalls and a bottom of the recess with a semiconductor material; filling the recess by forming a dielectric material over the semiconductor material; forming a patterned mask layer over the metal gate and the dielectric layer, wherein a first opening of the patterned mask layer is directly over a portion of the dielectric layer adjacent to the metal gate; removing the portion of the dielectric layer to form a second opening in the dielectric layer, wherein the second opening exposes an underlying source/drain region; and filling the second opening with a conductive material. In an embodiment, the semiconductor material is amorphous silicon, and the dielectric material is silicon nitride. In an embodiment, the method further comprising, after etching the metal gate and before the lining, selectively forming a capping layer on the metal gate. In an embodiment, the second opening exposes a sidewall of the gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a metal gate structure over a semiconductor fin, wherein the metal gate structure is surrounded by an interlayer dielectric (ILD) layer;
   recessing the metal gate structure below an upper surface of gate spacers that extend along opposing sidewalls of the metal gate structure, wherein after the recessing, a recess is formed between the gate spacers;
   lining sidewalls and a bottom of the recess with a semiconductor material;
   after the lining, filling the recess with a dielectric material;
   forming a patterned etch stop layer stack over the dielectric material, the semiconductor material, and the ILD layer, wherein a first opening in the patterned etch stop layer stack is directly over the dielectric material, the semiconductor material, and a first portion of the ILD layer adjacent to the gate spacers;
   forming a second opening in the ILD layer by etching through the first opening to remove the first portion of the ILD layer, wherein forming the second opening comprises performing an etching process to remove the first portion of the ILD layer, wherein the etching process recesses the gate spacers more than the dielectric material and the semiconductor material, wherein the second opening exposes a source/drain region adjacent to the metal gate structure; and
   filling the second opening with a conductive material.

2. The method of claim 1, wherein the semiconductor material is amorphous silicon.

3. The method of claim 2, wherein the dielectric material is silicon nitride.

4. The method of claim 1, further comprising, before recessing the metal gate structure, selectively forming an etch stop layer over an upper surface of the ILD layer distal from the semiconductor fin, wherein a first portion of the semiconductor material contacts and extends along the etch stop layer.

5. The method of claim 4, further comprising, after filling the recess and before forming the patterned etch stop layer stack, performing a planarization process, wherein the planarization process removes the first portion of the semiconductor material and the etch stop layer.

6. The method of claim 4, wherein lining the sidewalls and the bottom of the recess comprises forming a conformal layer of the semiconductor material in the recess and along the upper surface of the ILD layer.

7. The method of claim 1, further comprising, after the recessing and before the lining, forming a capping layer over the metal gate structure, wherein the capping layer physically contacts the metal gate structure and the semiconductor material.

8. The method of claim 1, wherein forming the patterned etch stop layer stack comprises:
   forming an etch stop layer stack by forming a first sublayer, a second sublayer, and a third sublayer successively over the ILD layer, wherein the first sublayer, the second sublayer, and the third sublayer comprise different materials;
   forming a patterned mask layer over the etch stop layer stack; and
   patterning the etch stop layer stack using the patterned mask layer as an etching mask.

9. The method of claim 8, wherein the first sublayer is formed of tungsten doped silicon carbide, the second sublayer is formed of silicon oxide, and the third sublayer is formed of silicon.

10. The method of claim 1, further comprising, after filling the second opening:
    removing the patterned etch stop layer stack;
    forming an inter-metal dielectric (IMD) layer over the ILD layer; and
    forming a first via and a second via that extend through the IMD layer, wherein the first via further extends through the dielectric material and the semiconductor material and is electrically coupled to the metal gate structure, wherein the second via is electrically coupled to the conductive material.

11. A method of forming a semiconductor device, the method comprising:
    forming a first metal gate structure over a fin;
    forming a second metal gate structure over the fin and adjacent to the first metal gate structure, wherein the first metal gate structure and the second metal gate structure are surrounded by an interlayer dielectric (ILD) layer;
    recessing the first metal gate structure and the second metal gate structure to form a first opening between first gate spacers and to form a second opening between second gate spacers, respectively, wherein the first gate spacers are on opposing sidewalls of the first metal gate structure, and the second gate spacers are on opposing sidewalls of the second metal gate structure;
    after the recessing, forming a conductive capping layer on the first metal gate structure and on the second metal gate structure;
    after forming the conductive capping layer, conformally forming a semiconductor material along sidewalls and bottoms of the first opening and the second opening;
    filling the first opening and the second opening by forming a dielectric material on the semiconductor material; and
    forming a self-aligned contact between the first metal gate structure and the second metal gate structure, wherein the self-aligned contact is electrically coupled to an underlying source/drain region between the first metal gate structure and the second metal gate structure.

12. The method of claim 11, wherein forming the self-aligned contact comprises, after filling the first opening and the second opening:
    forming an etch stop layer stack over the ILD layer, wherein the etch stop layer stack comprises a plurality of layers, each of the plurality of layers being formed of a different material;
    forming a first opening in the etch stop layer stack over the first metal gate structure and over a first portion of the ILD layer between the first metal gate structure and the second metal gate structure;
    removing the first portion of the ILD layer to form a second opening in the ILD layer, wherein the second opening exposes the underlying source/drain region; and
    filling the second opening with a conductive material, wherein the conductive material extends continuously from the first metal gate structure to the second metal gate structure.

13. The method of claim 12, wherein forming the etch stop layer stack comprises:

forming a first layer of tungsten doped silicon carbide over the ILD layer;

forming a second layer of silicon oxide over the first layer; and forming a third layer of silicon over the second layer.

14. The method of claim 11, wherein the semiconductor material is amorphous silicon, and the dielectric material is silicon nitride.

15. A method of forming a semiconductor device, the method comprising:

forming a fin protruding above a substrate;

forming a metal gate over the fin, wherein the metal gate is surrounded by a dielectric layer;

etching the metal gate to reduce a height of the metal gate, wherein after the etching, a recess is formed over the metal gate between gate spacers of the metal gate;

after etching the metal gate, forming a conductive capping layer in the recess on the metal gate;

after forming the conductive capping layer, lining sidewalls and a bottom of the recess with a semiconductor material;

filling the recess by forming a dielectric material over the semiconductor material;

forming a patterned mask layer over the metal gate and the dielectric layer, wherein a first opening of the patterned mask layer is directly over a portion of the dielectric layer adjacent to the metal gate;

removing the portion of the dielectric layer to form a second opening in the dielectric layer, wherein the second opening exposes an underlying source/drain region; and filling the second opening with a conductive material.

16. The method of claim 15, wherein the semiconductor material is amorphous silicon, and the dielectric material is silicon nitride.

17. The method of claim 15, wherein the second opening exposes a sidewall of the gate spacers.

18. The method of claim 15, further comprising, before etching the metal gate, selectively forming an etch stop layer over an upper surface of the dielectric layer distal from the fin.

19. The method of claim 18, wherein lining the sidewalls and the bottom of the recess comprises conformally forming the semiconductor material in the recess and along the upper surface of the dielectric layer, wherein a first portion of the semiconductor material along the upper surface of the dielectric layer contacts and extends along the etch stop layer.

20. The method of claim 19, further comprising, after filling the recess and before forming the patterned mask layer, performing a planarization process, wherein the planarization process removes the first portion of the semiconductor material and the etch stop layer.

* * * * *